United States Patent
Wang et al.

(10) Patent No.: US 8,860,086 B2
(45) Date of Patent: Oct. 14, 2014

(54) SEMICONDUCTOR STRUCTURE AND METHOD FOR FORMING THE SAME

(75) Inventors: Jing Wang, Beijing (CN); Lei Guo, Beijing (CN)

(73) Assignee: Tsinghua University, Beijing (CN)

(*) Notice: Subject to any disclaimer, the term of this patent is extended or adjusted under 35 U.S.C. 154(b) by 0 days.

(21) Appl. No.: 13/376,765

(22) PCT Filed: Nov. 11, 2011

(86) PCT No.: PCT/CN2011/082112
§ 371 (c)(1),
(2), (4) Date: Dec. 7, 2011

(87) PCT Pub. No.: WO2012/163049
PCT Pub. Date: Dec. 6, 2012

(65) Prior Publication Data
US 2014/0138741 A1    May 22, 2014

(30) Foreign Application Priority Data
Jun. 3, 2011  (CN) .......................... 2011 1 0149943

(51) Int. Cl.
*H01L 29/66* (2006.01)
*H01L 21/764* (2006.01)
*H01L 29/778* (2006.01)
*H01L 21/8234* (2006.01)

(52) U.S. Cl.
CPC ............ *H01L 29/778* (2013.01); *H01L 21/764* (2013.01); *H01L 29/66431* (2013.01); *H01L 21/823412* (2013.01); *H01L 21/823481* (2013.01); *H01L 21/823418* (2013.01)
USPC .......................................... 257/192; 257/190

(58) Field of Classification Search
CPC .............................. H01L 29/72; H01L 29/127
USPC .......................... 257/24, 27, 192, 738, 14, 200
See application file for complete search history.

(56) References Cited

U.S. PATENT DOCUMENTS

| | | | |
|---|---|---|---|
| 5,608,231 A * | 3/1997 | Ugajin et al. .................... 257/24 |
| 6,940,098 B1 * | 9/2005 | Tadatomo et al. ............... 257/87 |
| 7,211,458 B2 * | 5/2007 | Ozturk et ......................... 438/36 |
| 2012/0305988 A1 * | 12/2012 | Wang et al. .................... 257/192 |

FOREIGN PATENT DOCUMENTS

| | | |
|---|---|---|
| CN | 1783512 A | 6/2006 |
| CN | 102214685 A | 10/2011 |
| JP | 2000-323714 A | 11/2000 |
| WO | 2012163049 A1 | 12/2012 |

* cited by examiner

*Primary Examiner* — Yu-Hsi D Sun
*Assistant Examiner* — Christina Sylvia
(74) *Attorney, Agent, or Firm* — Dennemeyer & Associates, LLC

(57) ABSTRACT

A semiconductor structure and a method for forming the same are provided. The semiconductor structure comprises: a Si substrate (1100); a plurality of convex structures (1200) formed on the Si substrate (1100), in which every two adjacent convex structures (1200) are separated by a cavity in a predetermined pattern, and the cavity between every two adjacent convex structures (1200) is less than 50 nm in width; a first semiconductor film (1300), in which the first semiconductor film (1300) is formed between the every two adjacent convex structures (1200) and connected with tops of the every two adjacent convex structures (1200); a buffer layer (2100) formed on the first semiconductor film (1300); and a high-mobility III-V compound semiconductor layer (2000) formed on the buffer layer (2100).

16 Claims, 4 Drawing Sheets

SEMICONDUCTOR STRUCTURE AND METHOD FOR FORMING THE SAME

FIELD

The present disclosure relates to a semiconductor manufacture and design, and more particularly to a semiconductor structure and a method for forming the same.

BACKGROUND

For a long time, in order to achieve a higher chip density, a faster working speed and a lower power consumption, a feature size of a MOSFET (metal-oxide-semiconductor field effect transistor) is continuously scaled down according to Moore's law, and a working speed of the MOSFET is faster and faster. Currently, the feature size of the MOSFET has reached a nanometer level. However, a serious challenge is an emergence of a short-channel effect, such as a subthreshold voltage roll-off ($V_t$ roll-off), a DIBL (drain-induced barrier lowering) and a source-drain punch through, thus increasing an off-state leakage current. Therefore, a performance of the MOSFET may be deteriorated. In addition, for an III-V compound device, there is a large lattice mismatch between III-V compound materials and Si materials, so that a dislocation density may be higher. Therefore, a buffer layer, for example, a GaAs layer, may need to be formed between the III-V compound materials and the Si materials, which may not only improve an interface state between the III-V compound materials and the Si materials, but also alleviate a lattice mismatch between the III-V compound materials and the Si materials. However, the conventional buffer layer is thick, and a defect density is high, thus further deteriorating the performance of the MOSFET.

SUMMARY

The present disclosure is aimed to solve at least one of the above mentioned technical problems.

According to an aspect of the present disclosure, a semiconductor structure is provided. The semiconductor structure comprises: a Si substrate; a plurality of convex structures formed on the Si substrate, in which every two adjacent convex structures are separated by a cavity in a predetermined pattern, and the cavity between every two adjacent convex structures is less than 50 nm in width; a first semiconductor film formed on the plurality of convex structures, wherein a part of the first semiconductor film on the cavity is floated and separated from the Si substrate; a buffer layer formed on the first semiconductor film; and a high-mobility III-V compound semiconductor layer formed on the buffer layer.

In one embodiment, the semiconductor structure further comprises: a gate stack formed on the high-mobility III-V compound semiconductor layer; and a source region and a drain region formed in the high-mobility III-V compound semiconductor layer and on sides of the gate stack respectively.

In one embodiment, a width of each convex structure increases gradually from a middle part thereof to a top part thereof so that a cavity between top parts of two adjacent convex structures is less than that between middle parts of the two adjacent convex structures.

In one embodiment, a material forming each convex structure comprises $Si_{1-x}C_x$, $Si_yGe_{1-y}$ or Ge, and the first semiconductor film is a $Si_{1-x}C_x$ layer, a $Si_yGe_{1-y}$ layer or a Ge layer.

In one embodiment, each convex structure comprises a bottom layer and a top layer, the bottom layer is a Si layer, and the top layer is a $Si_yGe_{1-y}$ layer or a Ge layer.

In one embodiment, the first semiconductor film is formed by annealing the plurality of convex structures at a temperature of 300-1350 degrees Celsius in an ambient containing hydrogen.

In one embodiment, the material forming each convex structure comprises $Si_yGe_{1-y}$, and the first semiconductor film is a Ge layer.

According to another aspect of the present disclosure, a method for forming a semiconductor structure is provided. The method comprises steps of: providing a Si substrate; forming a plurality of convex structures on the Si substrate, in which every two adjacent convex structures are separated by a cavity in a predetermined pattern, and the cavity size between every two adjacent convex structures is less than 50 nm in width; forming a semiconductor film on tops of the plurality of convex structures, in which a first part of the semiconductor film on the cavity is spaced apart from the Si substrate; forming a buffer layer on the first semiconductor film; and forming a high-mobility III-V compound semiconductor layer on the buffer layer.

In one embodiment, the method further comprises: forming a gate stack on the high-mobility III-V compound semiconductor layer; and forming a source region and a drain region in the high-mobility III-V compound semiconductor layer and on sides of the gate stack respectively.

In one embodiment, a material forming each convex structure comprises $Si_{1-x}C_x$, $Si_yGe_{1-y}$ or Ge, and the first semiconductor film is a $Si_{1-x}C_x$ layer, a $Si_yGe_{1-y}$ layer or a Ge layer.

In one embodiment, a width, of each convex structure increases gradually from a middle part thereof to a top part thereof so that a cavity size between top parts of two adjacent convex structures is less than that between middle parts of the two adjacent convex structures.

In one embodiment, each convex structure comprises a bottom layer and a top layer, the bottom layer is a Si layer, and the top layer is a $Si_yGe_{1-y}$ layer or a Ge layer.

In one embodiment, the first semiconductor film is formed by annealing the plurality of convex structures at a temperature of 300-1350 degrees Celsius in an ambient containing hydrogen.

In one embodiment, the material forming each convex structure comprises Ge, and the ambient further comprises $GeH_4$ so that the first semiconductor film is a Ge layer.

In one embodiment, the step of forming a semiconductor film on the plurality of convex structures comprises: forming the semiconductor film on the plurality of convex structures by epitaxy.

In one embodiment, the step of forming a plurality of convex structures on the Si substrate comprises: forming a first semiconductor layer on the Si substrate; implanting Si or Ge ions into the first semiconductor layer to form an ion-implanted layer in the first semiconductor layer; and selectively etching the first semiconductor layer to form the plurality of convex structures.

In one preferred embodiment, the material forming each convex structure comprises Ge, and the first semiconductor layer is a Ge layer, so that the high-mobility III-V compound semiconductor layer may be directly formed on the Ge layer. The first semiconductor layer is very thin, and consequently the first semiconductor layer may be relaxed during the forming of the convex structures and the subsequent high-temperature annealing. After the first semiconductor layer is relaxed, the high-mobility III-V compound semiconductor layer is formed by epitaxy, which may largely reduce the dislocation density in the buffer layer and the high-mobility III-V compound semiconductor layer so as to form a high-quality heteroepitaxial structure. In addition, because the convex structures may release a part of a thermal mismatch stress, a growth quality of the buffer layer may be ensured, and the buffer layer may be very thin. Moreover, because the high-mobility III-V compound semiconductor layer is directly formed on the first semiconductor layer, for example, a Ge layer, Ge materials may be used as a buffer layer between Si materials and III-V compound materials.

According to an embodiment of the present disclosure, the first semiconductor film are used. In this way, on one hand, dopants in the source and the drain may be prevented from diffusing into a substrate, so that an ultra-shallow junction may be easy to fabricate. On the other hand, the source and the drain may not contact with the substrate, thus inhibiting band-to-band tunneling (BTBT) leakage between the source and the substrate and between the drain and the substrate. Furthermore, parasitic junction capacitance of the source and the drain may be reduced, thus improving the performance of the device.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
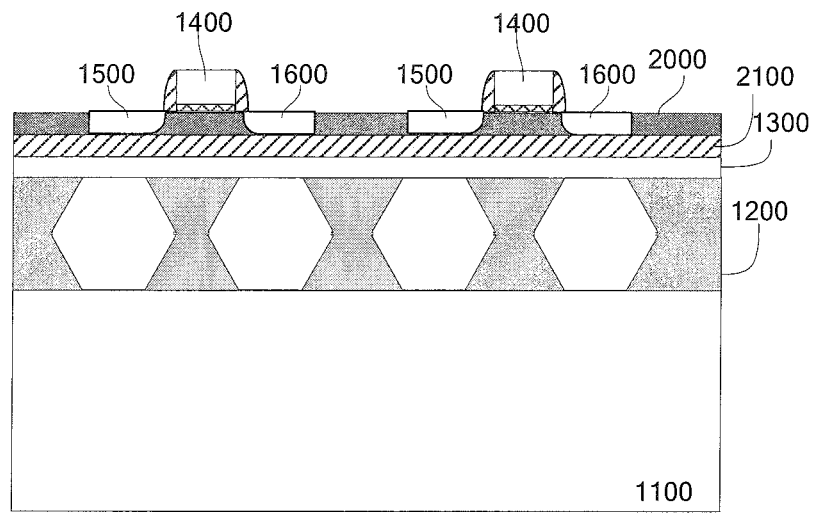
FIG. 1 is a cross-sectional view of a semiconductor structure according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

Figure 2:
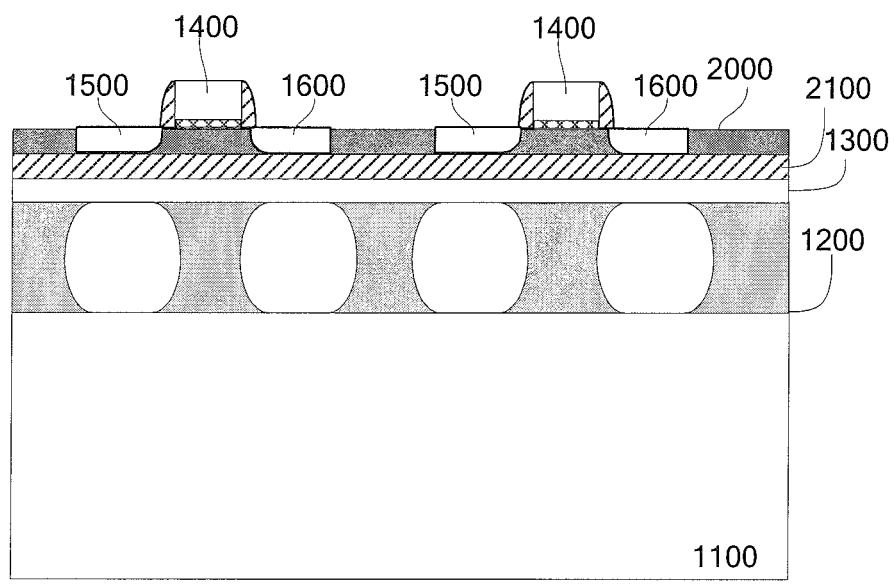
FIG. 2 is a cross-sectional view of a semiconductor structure according to another embodiment of the present disclosure.

FIG. 1 is a cross-sectional view of a semiconductor structure according to an embodiment of the present disclosure. FIG. 2 is a cross-sectional view of a semiconductor structure according to another embodiment of the present disclosure. The semiconductor structure comprises a substrate 1100; a plurality of convex structures 1200 formed on the substrate 1100, in which every two adjacent convex structures 1200 are separated by a cavity in a predetermined pattern. In some embodiments, the cavity between every two adjacent convex structures is less than 50 nm in width, preferably, 30 nm. It should be noted that, in some embodiments, the convex structures 1200 may be a vertical structure. However, in other embodiments, as shown in FIGS. 1-2, a width of each convex structure 1200 increases gradually from a middle part thereof to a top part thereof so that a cavity size between top parts of two adjacent convex structures 1200 is less than that between middle parts of the two adjacent convex structures 1200. Therefore, a first semiconductor film 1300 may be formed by annealing the convex structures 1200 or by epitaxy. If the cavity size between top parts of two adjacent convex structures 1200 is less than that between middle parts of the two adjacent convex structures 1200, the cavity size between every two adjacent convex structures is the nearest cavity size between the two adjacent convex structures 1200, i.e., the cavity size between the top parts of the two adjacent convex structures 1200. The semiconductor structure according to an embodiment of the present disclosure may be applied to a small size device, particularly used for alleviating a leakage of a small size device.

The semiconductor structure further comprises a first semiconductor film 1300, in which the first semiconductor film 1300 is formed on the convex structures 1200; a buffer layer 2100 formed on the first semiconductor film; and a high-mobility III-V compound semiconductor layer 2000, for example, an InGaAs layer, a GaAs layer, an InP layer, a GaSb layer, an InSb layer or an InAs layer, formed on the buffer layer 2100. In one embodiment, the buffer layer 2100 may also be an III-V compound semiconductor layer 2000, for example, a GaAs layer or an InP layer. The semiconductor structure further comprises a gate stack 1400 formed on the high-mobility III-V compound semiconductor layer 2000. The gate stack 1400 comprises a gate dielectric layer and a gate electrode, for example, a high k gate dielectric layer. In this embodiment, two independent semiconductor structures are shown, each semiconductor structure forms a device, and the two devices are isolated from each other.

The semiconductor structure further comprises a source region 1500 and a drain region 1600 formed in the high-mobility III-V compound semiconductor layer 2000 and on sides of the gate stack 1400 respectively.

In one embodiment, the substrate 1100 is a substrate or a $Si_yGe_{1-y}$ substrate with low Ge content, and the first semiconductor film 1300 is a $Si_{1-x}C_x$ layer, a $Si_yGe_{1-y}$ layer with high Ge content, or a Ge layer. In another embodiment, if the first semiconductor film 1300 is formed by epitaxy, the first semiconductor film 1300 may also be an III-V compound semiconductor layer.

In one embodiment, a material forming each convex structure 1200 comprises $Si_{1-x}C_x$, $Si_yGe_{1-y}$ with high Ge content, or Ge. Therefore, the first semiconductor film may be formed by annealing the convex structures 1200 or by epitaxy.

In some embodiments, the first semiconductor film may be formed by annealing the plurality of convex structures 1200. In some embodiments, the annealing is performed at a temperature of 300-1350 degrees Celsius in an ambient containing hydrogen to migrate atoms on surfaces of the plurality of convex structures 1200. Since the ambient contains hydrogen, hydrogen may effectively facilitate a migration of atoms on surfaces of the plurality of convex structures 1200. Preferably, when the material forming each convex structure 1200 comprises $Si_yGe_{1-y}$ with high Ge content or Ge, the ambient further comprises at least one gas selected from a group consisting of $SiH_4$, $GeH_4$, $SiH_2Cl_2$, and $SiHCl_3$. A small amount of Si and/or Ge atoms are deposited on the surface of the first semiconductor film 1300 by decomposing the at least one gas, so that the surface of the first semiconductor film 1300 may be flattened, and a required flatness is achieved. After the annealing, the top parts of two adjacent convex structures 1200 may be connected with each other to form the first semiconductor film 1300. In one embodiment, for different materials forming the convex structures, an annealing temperature is different. For example, for Si materials, the annealing temperature is about 1200 degrees Celsius, and for Ge materials, the annealing temperature is about 900 degrees Celsius. In one preferred embodiment, the material forming each convex structure comprises $Si_yGe_{1-y}$, and the ambient further comprises $GeH_4$ so that the first semiconductor film is a Ge layer. In this embodiment, the higher the content of Ge in the first semiconductor film 1300, the lower the annealing temperature is. For example, if the first semiconductor film 1300 are a Ge layer, the annealing temperature may be 300 degrees Celsius.

Figure 3:
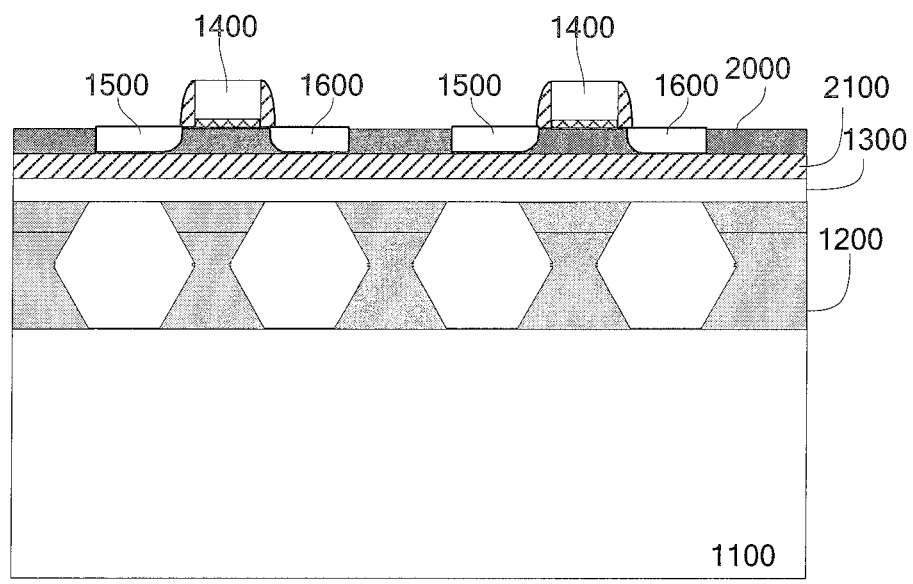
FIG. 3 is a cross-sectional view of a semiconductor structure according to still another embodiment of the present disclosure.

In another embodiment, each convex structure 1200 comprises a bottom layer and a top layer. FIG. 3 is a cross-sectional view of a semiconductor structure according to still another embodiment of the present disclosure. In some embodiments, the bottom layer is a Si layer, and the top layer is a $Si_yGe_{1-y}$ layer or a Ge layer. For example, as shown in FIG. 3, in each convex structure 1200, the bottom layer is a Si layer, and the top layer is a Ge layer. In this way, the Si layer may be used as a buffer layer between the substrate 1100 and the Ge layer.

Figure 4:
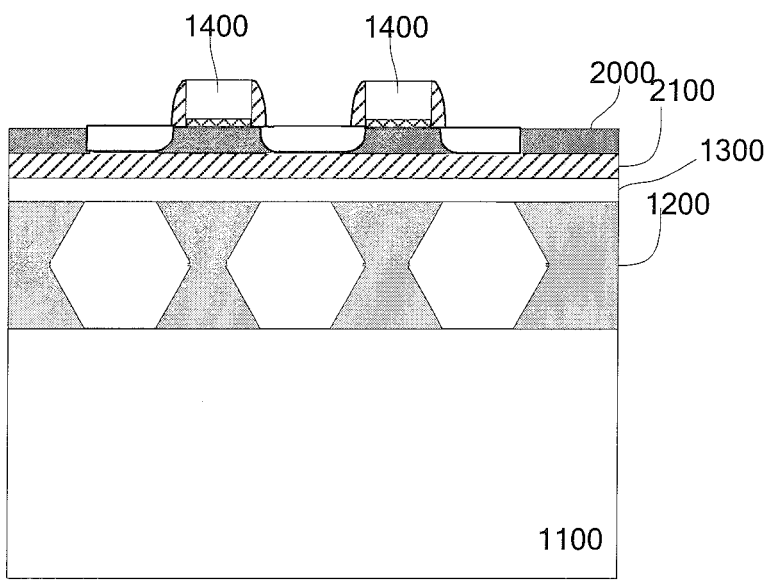
FIG. 4 is a cross-sectional view of a semiconductor structure with a common source region or a common drain region according to an embodiment of the present disclosure.
Figure 5:
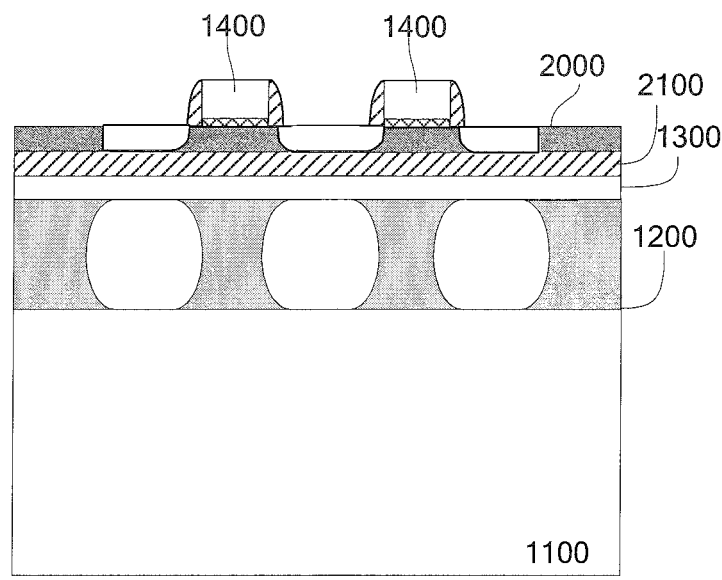
FIG. 5 is a cross-sectional view of a semiconductor structure with a common source region or a common drain region according to another embodiment of the present disclosure.

In other embodiments, a semiconductor structure with a common source region and a common drain region may also be formed, as shown in FIGS. 4-5.

Figure 6:
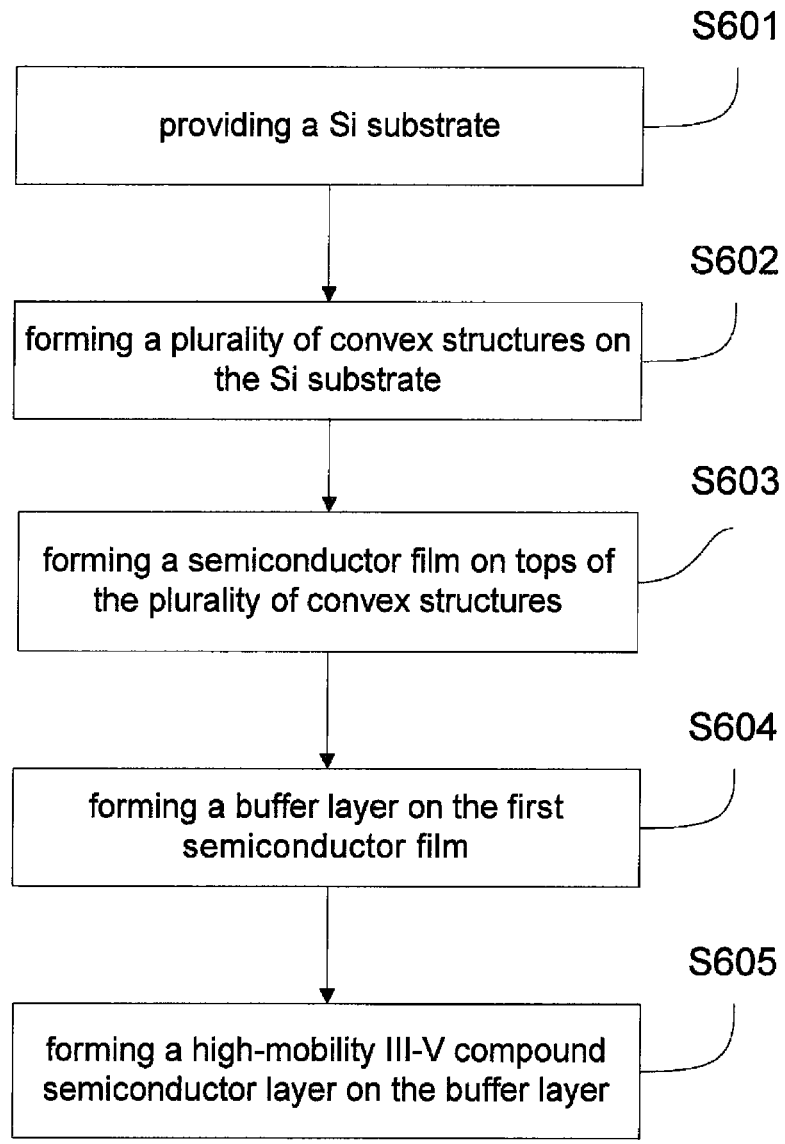
FIG. 6 is a flow chart of a method for forming a semiconductor structure according to an embodiment of the present disclosure.

FIG. 6 is a flow chart of a method for forming a semiconductor structure according to an embodiment of the present disclosure. The method comprises the following steps.

Step S601, a substrate is provided. The substrate is a Si substrate or a $Si_yGe_{1-y}$ substrate with low Ge content.

Step S602, a plurality of convex structures are formed on the substrate, in which every two adjacent convex structures are separated by a cavity in a predetermined pattern. In some embodiments, a cavity between every two adjacent convex structures is less than 50 nm in width, and preferably, 30 nm. A width of each convex structure increases gradually from a middle part thereof to a top part thereof so that a cavity size between top parts of two adjacent convex structures is less than that between middle parts of the two adjacent convex structures. Therefore, a first semiconductor film may be formed by annealing the convex structures or by epitaxy. Particularly, in some embodiments, at least one first semiconductor layer is formed on the substrate by epitaxy, and then the at least one first semiconductor layer is etched to form the plurality of convex structures, in which the at least one first semiconductor layer is a Si layer, a $Si_yGe_{1-y}$ layer or a Ge layer. Certainly, in other embodiments, a surface layer of the substrate is used as the first semiconductor layer, that is, a surface of the substrate is directly etched to form the plurality of convex structures. Preferably, in order to form the plurality of convex structures shown in FIG. 1, the first semiconductor layer may be etched by an anisotropic wet etching.

Alternatively, in another preferred embodiment, Si or Ge ions are implanted into the first semiconductor layer to form an ion-implanted layer in the first semiconductor layer, and then the first semiconductor layer is selectively etched by a dry etching to form the plurality of convex structures. Because crystal structures in the ion-implanted layer are damaged seriously, an etching rate in the ion-implanted layer is greater than that in other parts of the first semiconductor layer, thus forming the plurality of convex structures shown in FIG. 2.

Step S603, a first semiconductor film is formed on tops of the plurality of convex structures, in which a first part of the semiconductor film on the cavity is spaced apart from the substrate. In some embodiments, the first semiconductor film is a Si layer, a $Si_yGe_{1-y}$ layer with high Ge content, or a Ge layer.

In one embodiment, the first semiconductor film may be formed by annealing the plurality of convex structures. In some embodiments, the annealing is performed at a temperature of 300-1350 degrees Celsius in an ambient containing hydrogen to migrate atoms on surfaces of the plurality of convex structures. Preferably, the ambient further comprises at least one gas selected from a group consisting of $SiH_4$, $GeH_4$, $SiH_2Cl_2$, and $SiHCl_3$. A small amount of Si and/or Ge atoms are deposited on the surface of the first semiconductor film by decomposing the at least one gas, so that the surface of the first semiconductor film may be flattened. In one embodiment, the material forming each convex structure comprises Ge, and the ambient further comprises $GeH_4$ so that the first semiconductor film is a Ge layer.

In one embodiment, a material forming each convex structure comprises $Si_{1-x}C_x$, $Si_yGe_{1-y}$ or Ge.

In another embodiment, each convex structure comprises a bottom layer and a top layer, the bottom layer is a Si layer, and the top layer is a $Si_yGe_{1-y}$ layer with high Ge content or a Ge layer.

In another embodiment, the first semiconductor film may also be formed by epitaxy. In this embodiment, the first semiconductor film is formed on the plurality of convex structures by epitaxy. In some embodiments, the substrate may be a Si substrate, a $Si_{1-x}C_x$ substrate, a SiGe substrate or a Ge substrate with a surface of a crystal orientation (100), in which x is within a range from 0 to 0.1. Because a lateral epitaxial growth rate of the first semiconductor film with a certain crystal orientation is not less than a longitudinal growth rate thereof, a gap between top parts of two adjacent convex structures may be quickly sealed up by epitaxial materials. Therefore, the first semiconductor film may not contact with the substrate directly, so that a part of the first semiconductor film may be separated from the substrate. In another embodiment, if the first semiconductor film are formed by epitaxy, the first semiconductor film may also be an III-V compound semiconductor layer.

In one preferred embodiment, after the annealing or the epitaxy, if the first semiconductor film is thick, the first semiconductor film may be subjected to an etching or a thinning process.

Step S604, a buffer layer is formed on the first semiconductor film.

Step S605, a high-mobility III-V compound semiconductor layer is formed on the buffer layer.

In one embodiment, a gate stack is formed on the high-mobility III-V compound semiconductor layer, and a source region and a drain region are formed in the high-mobility III-V compound semiconductor layer and on sides of the gate stack respectively.

In one preferred embodiment, the material forming each convex structure comprises Ge, and the first semiconductor layer is a Ge layer, so that the high-mobility III-V compound semiconductor layer may be directly formed on the Ge layer. The first semiconductor layer is very thin, and consequently the first semiconductor layer may be relaxed during the forming of the convex structures and the subsequent high-temperature annealing. After the first semiconductor layer is relaxed, the high-mobility III-V compound semiconductor layer is formed by epitaxy, which may largely reduce the dislocation density in the buffer layer and the high-mobility III-V compound semiconductor layer so as to form a high-quality heteroepitaxial structure. In addition, because the convex structures may release a part of a thermal mismatch stress, a growth quality of the buffer layer may be ensured, and the buffer layer may be very thin. Moreover, because the high-mobility III-V compound semiconductor layer is directly formed on the first semiconductor layer, for example, a Ge layer, Ge materials may be used as a buffer layer between Si materials and III-V compound materials.

According to an embodiment of the present disclosure, the first semiconductor film is used. In this way, on one hand, dopants in the source and the drain may be prevented from diffusing into a substrate, so that an ultra-shallow junction may be easy to fabricate. On the other hand, the source and the drain may not contact with the substrate, thus inhibiting BTBT leakage between the source and the substrate and between the drain and the substrate. Furthermore, parasitic junction capacitance of the source and the drain may be reduced, thus improving the performance of the device.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A semiconductor structure, comprising:
    a Si substrate;
    a plurality of convex structures formed on the Si substrate, wherein every two adjacent convex structures are separated by a cavity in a predetermined pattern, and the cavity between every two adjacent convex structures is less than 50 nm in width;
    a first semiconductor film formed on the plurality of convex structures, wherein a part of the first semiconductor film on the cavity is floated and separated from the Si substrate;
    a buffer layer formed on the first semiconductor film; and
    a high-mobility III-V compound semiconductor layer formed on the buffer layer.

2. The semiconductor structure according to claim 1, further comprising:
    a gate stack formed on the high-mobility III-V compound semiconductor layer; and
    a source region and a drain region formed in the high-mobility III-V compound semiconductor layer and on sides of the gate stack respectively.

3. The semiconductor structure according to claim 1, wherein a width of each convex structure increases gradually from a middle part thereof to a top part thereof so that a cavity size between top parts of two adjacent convex structures is less than that between middle parts of the two adjacent convex structures.

4. The semiconductor structure according to claim 1, wherein a material forming each convex structure comprises $Si_{1-x}C_x$, $Si_yGe_{1-y}$ or Ge, and the first semiconductor film is a $Si_{1-x}C_x$ layer, a $Si_yGe_{1-y}$ layer or a Ge layer.

5. The semiconductor structure according to claim 1, wherein each convex structure comprises a bottom layer and a top layer, the bottom layer is a Si layer, and the top layer is a $Si_yGe_{1-y}$ layer or a Ge layer.

6. The semiconductor structure according to claim 1, wherein the first semiconductor film is formed by annealing the plurality of convex structures at a temperature of 300-1350 degrees Celsius in an ambient containing hydrogen.

7. The semiconductor structure according to claim 4, wherein the material forming each convex structure comprises $Si_yGe_{1-y}$, and the first semiconductor film is a Ge layer.

8. A method for forming a semiconductor structure, comprising steps of:
    providing a Si substrate;
    forming a plurality of convex structures on the Si substrate, wherein every two adjacent convex structures are separated by a cavity in a predetermined pattern, and the cavity between every two adjacent convex structures is less than 50 nm in width;
    forming a semiconductor film on tops of the plurality of convex structures, wherein a first part of the semiconductor film on the cavity is spaced apart from the Si substrate;
    forming a buffer layer on the first semiconductor film; and
    forming a high-mobility III-V compound semiconductor layer on the buffer layer.

9. The method according to claim 8, further comprising:
    forming a gate stack on the high-mobility III-V compound semiconductor layer; and
    forming a source region and a drain region in the high-mobility III-V compound semiconductor layer and on sides of the gate stack respectively.

10. The method according to claim 8, wherein a material forming each convex structure comprises $Si_{1-x}C_x$, $Si_yGe_{1-y}$ or Ge, and the first semiconductor film is a $Si_{1-x}C_x$ layer, a $Si_yGe_{1-y}$ layer or a Ge layer.

11. The method according to claim 8, wherein a width of each convex structure increases gradually from a middle part thereof to a top part thereof so that a cavity size between top parts of two adjacent convex structures is less than that between middle parts of the two adjacent convex structures.

12. The method according to claim 8, wherein each convex structure comprises a bottom layer and a top layer, the bottom layer is a Si layer, and the top layer is a $Si_yGe_{1-y}$ layer or a Ge layer.

13. The method according to claim 10, wherein the first semiconductor film is formed by annealing the plurality of convex structures at a temperature of 300-1350 degrees Celsius in an ambient containing hydrogen.

14. The method according to claim 13, wherein the material forming each convex structure comprises Ge, and the ambient further comprises $GeH_4$ so that the first semiconductor film is a Ge layer.

15. The method according to claim 9, wherein the step of forming a semiconductor film on the plurality of convex structures comprises:
   forming the semiconductor film on the plurality of convex structures by epitaxy.

16. The method according to claim 9, wherein the step of forming a plurality of convex structures on the Si substrate comprises:
   forming a first semiconductor layer on the Si substrate;
   implanting Si or Ge ions into the first semiconductor layer to form an ion-implanted layer in the first semiconductor layer; and
   selectively etching the first semiconductor layer to form the plurality of convex structures.

* * * * *